United States Patent
Sambamurthy et al.

(10) Patent No.: US 11,829,222 B2
(45) Date of Patent: Nov. 28, 2023

(54) OPERATING VOLTAGE ADJUSTMENT FOR AGING CIRCUITS

(71) Applicant: Advanced Micro Devices, Inc., Santa Clara, CA (US)

(72) Inventors: Sriram Sambamurthy, Austin, TX (US); Sriram Sundaram, Austin, TX (US); Indrani Paul, Austin, TX (US); Larry David Hewitt, Austin, TX (US); Anil Harwani, Austin, TX (US); Aaron Joseph Grenat, Austin, TX (US); Dana Glenn Lewis, Austin, TX (US); Leonardo Piga, Austin, TX (US); Wonje Choi, Austin, TX (US); Karthik Rao, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 119 days.

(21) Appl. No.: 17/127,681

(22) Filed: Dec. 18, 2020

(65) Prior Publication Data

US 2022/0100249 A1 Mar. 31, 2022

Related U.S. Application Data (60) Provisional application No. 63/083,475, filed on Sep. 25, 2020.

(51) Int. Cl.
*G06F 1/28* (2006.01)
*G01R 31/40* (2020.01)
*G06F 1/30* (2006.01)

(52) U.S. Cl.
CPC ............... *G06F 1/28* (2013.01); *G01R 31/40* (2013.01); *G06F 1/30* (2013.01)

(58) Field of Classification Search
CPC ......... G06F 1/28; G06F 1/30; G01R 31/2858; G01R 31/31725; G01R 31/40
See application file for complete search history.

(56) References Cited

U.S. PATENT DOCUMENTS 9,450,833 B2  9/2016  Griffith et al.
10,060,955 B2  8/2018  Grenat et al.
(Continued)

FOREIGN PATENT DOCUMENTS

| | | |
|---|---|---|
| CN | 106656162 B | 12/2019 |
| EP | 2590052 A2 | 5/2013 |
| JP | 2009152311 A | * 7/2009 |

OTHER PUBLICATIONS

International Search Report and Written Opinion in International Application No. PCT/US2021/052145, dated Jan. 28, 2022, 12 pages.
(Continued)

*Primary Examiner* — Terrell S Johnson
(74) *Attorney, Agent, or Firm* — KOWERT HOOD MUNYON RANKIN AND GOETZEL PC; Rory D. Rankin (57) ABSTRACT

A system and method for updating power supply voltages due to variations from aging are described. A functional unit includes a power supply monitor capable of measuring power supply variations in a region of the functional unit. An age counter measures an age of the functional unit. A control unit notifies the power supply monitor to measure an operating voltage reference. When the control unit receives a measured operating voltage reference, the control unit determines an updated age of the region different from the current age based on the measured operating voltage reference. The control unit updates the age counter with the corresponding age, which is younger than the previous age in some cases due to the region not experiencing predicted stress and
(Continued)

aging. The control unit is capable of determining a voltage adjustment for the operating voltage reference based on an age indicated by the age counter.

20 Claims, 5 Drawing Sheets

(56) References Cited

U.S. PATENT DOCUMENTS

| | | |
|---|---|---|
| 10,714,152 B1 | 7/2020 | Rodriguez et al. |
| 2009/0167260 A1 | 7/2009 | Pauritsch et al. |
| 2013/0117582 A1* | 5/2013 | Satyamoorthy ......... G06F 1/324 |
| | | 713/300 |
| 2014/0176116 A1* | 6/2014 | Kumar ............... G01R 31/2884 |
| | | 327/564 |
| 2015/0054479 A1 | 2/2015 | Shiwaya et al. |
| 2015/0378411 A1 | 12/2015 | Grenat et al. |
| 2016/0268816 A1 | 9/2016 | Mao |
| 2016/0268828 A1 | 9/2016 | Mao |
| 2018/0019615 A1 | 1/2018 | Wilson et al. |
| 2018/0019667 A1 | 1/2018 | Salem et al. |
| 2018/0048265 A1 | 2/2018 | Nentwig |
| 2018/0145683 A1 | 5/2018 | Shimizu et al. |
| 2018/0183332 A1 | 6/2018 | Herzer et al. |
| 2018/0205315 A1 | 7/2018 | Giuliano et al. |
| 2018/0316268 A1 | 11/2018 | Liu et al. |
| 2018/0367033 A1 | 12/2018 | Kotikalapoodi |
| 2018/0375362 A1 | 12/2018 | Huang et al. |
| 2019/0074769 A1 | 3/2019 | Youn et al. |
| 2019/0181755 A1 | 6/2019 | Swamy |
| 2019/0181760 A1 | 6/2019 | Choi et al. |
| 2019/0273433 A1 | 9/2019 | Salem et al. |
| 2019/0326806 A1 | 10/2019 | Gong et al. |

OTHER PUBLICATIONS

Jain et al., "Conductance Modulation Techniques in Switched-Capacitor DC-DC Converter for Maximum-Efficiency Tracking and Ripple Mitigation in 22 nm Tri-Gate CMOS", IEEE Journal of Solid-State Circuits, Aug. 2015, pp. 1809-1819, vol. 50, No. 8.

Zheng et al., "A Systematic USFG Design Approach for Integrated Reconfigurable Switched-Capacitor Power Converters", IEEE Transactions on Circuits and Systems—1: Regular Papers, Nov. 2011, pp. 2790-2800, vol. 58, No. 11.

* cited by examiner

OPERATING VOLTAGE ADJUSTMENT FOR AGING CIRCUITS

CROSS REFERENCE TO RELATED APPLICATIONS

This application claims priority to Provisional Patent Application Ser. No. 63/083,475, entitled "OPERATING VOLTAGE ADJUSTMENT FOR AGING CIRCUITS", filed Sep. 25, 2020, the entirety of which is incorporated herein by reference.

BACKGROUND

Description of the Relevant Art

Both planar transistors (devices) and non-planar transistors are fabricated for use in integrated circuits within semiconductor chips. A variety of choices exist for placing processing circuitry in system packaging to integrate the multiple types of integrated circuits. Some examples are a system-on-a-chip (SOC), multi-chip modules (MCMs) and a system-in-package (SiP). Mobile devices, desktop systems and servers use these packages. Regardless of the choice for system packaging, in several uses, both power consumption and voltage droop of modern integrated circuits have become an increasing design issue with each generation of semiconductor chips.

Advances in semiconductor fabrication techniques have been reducing transistor dimensions in order to increase both performance and functionality within the same amount of space. The supply voltages for the integrated circuits have been scaling down to reduce both power consumption and short channel effects. Superscalar designs increase the density of integrated circuits on a die with multiple pipelines, larger caches, and more complex logic. Therefore, the number of nodes and buses that may switch per clock cycle significantly increases.

A simultaneous switching of a wide bus may cause a significant voltage drop if a supply pin served all of the line buffers on the bus. Parasitic inductance increases transmission line effects on a chip such as ringing and reduced propagation delays. The resulting voltage droop is proportional to the expression L di/dt, wherein L is the parasitic inductance and di/dt is the time rate of change of the current consumption. Now a node that holds a logic high value may experience a voltage droop that reduces its voltage value below a minimum threshold. For memories and latches without recovery circuitry, stored values may be lost. Power supply currents flowing through non-zero resistance wires also create an IR (current-resistance) voltage drop, which contributes to data retention corruption and timing failures in critical paths.

In addition to IR voltage droop and parasitic inductance voltage droop, aging of circuits contributes to data retention corruption and timing failures in critical paths. One example of aging is negative bias temperature instability (NBTI). Any solution placed in the integrated circuits is dependent on detecting degradation effects. Therefore, sensors and monitors are placed in integrated circuits to measure degradation effects of signals and routes within the integrated circuits. However, many measurements wait for a boot of the computing system, which includes an appreciable amount of time in many cases. Additionally, one-time static voltage guardbands provide an upfront penalty by increasing power consumption or reducing the operating clock frequency. Further, integrated circuits in different products age differently, so a single solution for products used for different workloads and operating conditions is not ideal.

In view of the above, efficient methods and mechanisms for updating power supply voltages due to variations from aging are desired.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for updating power supply voltages due to variations from aging are contemplated. A functional unit is representative of any processing unit capable of performing tasks corresponding to processing software applications, handling input/output (I/O) requests, and other tasks of a computing system. Examples of the functional unit are a general-purpose central processing unit (CPU), a field programmable gate arrays (FPGA), an application specific integrated circuit (ASIC), a parallel data processor such as a processor with a single instruction multiple data (SIMD) microarchitecture or a digital signal processor (DSP), and so forth. The functional unit has one or more power supply monitors placed in regions across the functional unit. A power supply monitor measures an operating voltage reference in a particular region of the functional unit. As used herein, the "operating voltage reference" is also referred to as the "power supply voltage." In one example, the region is a processor core of multiple processor cores and controllers and interfaces of the functional unit. In another example, the region is a region within the processor core, which uses multiple power supply monitors. Other regions, such as within a memory controller, an interface unit, or other, are possible and contemplated.

The power supply monitor measures an average operating voltage reference over a particular time period. For example, the power supply monitor receives the operating voltage reference from power supply voltage generating circuitry, and generates an indication of a count corresponding to the measured operating voltage reference. A mapping exists that relates the count determined over the particular time period to values of operating voltage references. In various embodiments, the power supply monitor is implemented as a time-to-digital converter (TDC). An age counter stores a value representative of an age of the integrated circuit. The age provides an indication of an amount of usage and stress experienced by the integrated circuit. In some embodiments, there is an age counter for each of multiple regions of the functional unit. In other embodiments, a single age counter is used for the functional unit. In various embodiments, the age counter is a time counter that stores an indication of a duration of time, which is used to indicate an amount of usage and stress experienced by the integrated circuit. In other words, the particular duration of time stored in the age counter can be used as an indication of an age of the integrated circuit, and this age can be used to estimate an amount of usage and stress experienced by the integrated circuit.

In an embodiment, the age counter is implemented by a 32-bit register, which counts, or increments, each time a particular time interval elapses such as a second. This age counter is capable of counting from zero to $4.2 \times 10^9$ seconds, which equals 136 years. The age counter is initialized with an initial age and begins incrementing from the initial age. A control unit of an age tracking unit is capable of sending a notification with a request to measure an operating voltage reference of the integrated circuit. The control unit sends this notification during particular events. Examples of such events are a boot of the functional unit and detected idle times of the functional unit. In response to the request, a measurement of the operating voltage reference is performed (e.g., by a power supply monitor).

When the control unit receives a measured operating voltage reference, the control unit determines an age of the integrated circuit based on the measured operating voltage reference. This determined age may be different from an age currently indicated by the age counter. For example, in various embodiments the control unit is capable of determining an operating voltage difference between the measured operating voltage reference and a desired operating voltage reference set by a power manager or other power supply voltage generating circuitry. The age tracking unit includes a structure (e.g., a table or otherwise) that has circuitry capable of storing mappings between measured voltage differences and ages of the integrated circuit. In one embodiment, the table stores values based on stress testing of the functional unit. In other embodiments, the values stored by the table may also be based at least in part of predictive formulas, estimates, or otherwise. The control unit indexes into the table with the determined difference and reads out the corresponding age.

The control unit updates the age counter with the corresponding age. In some examples, the corresponding age is younger than the previous age stored in the age counter due to the region not experiencing stress and aging as predicted during testing of the functional unit. The control unit determines when to update the operating voltage reference due to aging during particular events. Examples of these events are a particular time interval has elapsed and a power manager indicates it is updating operating parameters of the functional unit. The control unit determines a voltage adjustment for the operating voltage reference based at least in part on an age indicated by the age counter. The age tracking unit includes another second table storing mappings between ages of the integrated circuit and measured voltage adjustments. In contrast to the first table, the control unit accesses the second table with an index that is an indication of age, rather than a voltage difference. The control unit indexes into the second table with the age read from the age counter, reads out a voltage adjustment, and updates the operating voltage reference with the voltage adjustment.

Figure 1:
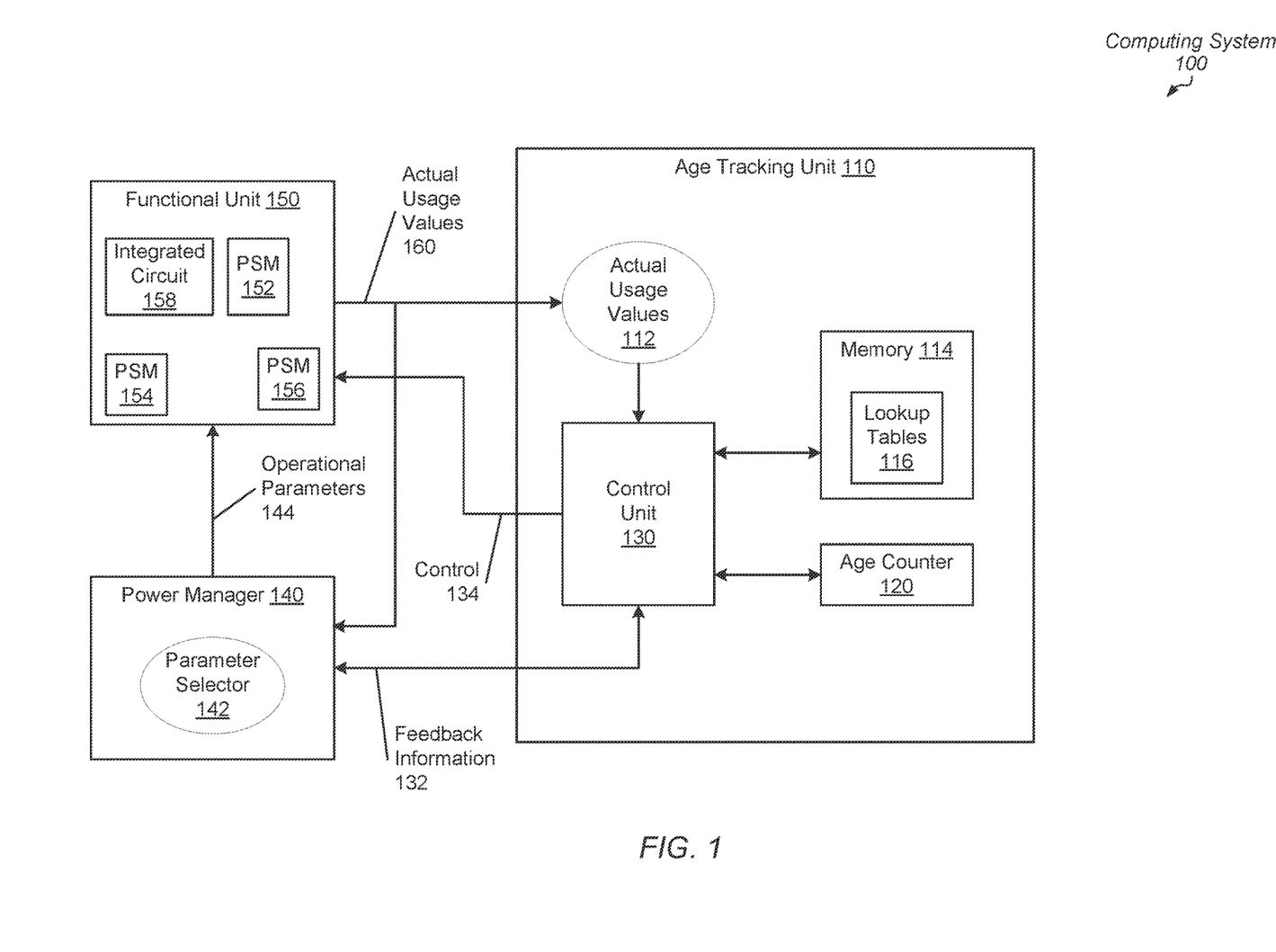
FIG. 1 is a generalized diagram of one embodiment of a computing system.

Turning to FIG. 1, a generalized block diagram of one embodiment of a computing system 100 is shown. As shown, the computing system 100 includes a functional unit 150, an age tracking unit 110 and a power manager 140. The functional unit 150 is representative of any circuitry with its own voltage and clock domain. The functional unit 150 conveys actual usage values 160 to each of the age tracking unit 110 and the power manager 140. Examples of the actual usage values 160 are operational parameters such as a clock frequency and a power supply voltage. The power supply monitors (PSMs) 152, 154 and 156 measure an operating voltage reference in a particular region of the functional unit. As described earlier, the "operating voltage reference" is also referred to as the "power supply voltage." The control unit 130 relies on information stored in the lookup tables 116 implemented in a memory 114 to update one or more of an age stored in the age counter 120 and an operating voltage reference of the functional unit 150. The control unit 130 sends an indication, via the feedback information 132, to the power manager 140 specifying an operating voltage reference to use for the functional unit 150.

A variety of choices exist for placing the circuitry of the computing system 100 in system packaging to integrate the multiple types of integrated circuits. Some examples are a system-on-a-chip (SOC), multi-chip modules (MCMs) and a system-in-package (SiP). Mobile devices, desktop systems and servers use these packages and the functionality of the computing system 100. Clock sources, such as phase lock loops (PLLs), interrupt controllers, power controllers, memory controllers, interfaces for input/output (I/O) devices, and so forth are not shown in FIG. 1 for ease of illustration. It is also noted that the number of components of the computing system 100 and the number of subcomponents for those shown in FIG. 1, such as within the functional unit 150, the age tracking unit 110 and the power manager 140, may vary from embodiment to embodiment. There may be more or fewer of each component/subcomponent than the number shown for the computing system 100.

In some embodiments, the functional unit 150 is representative of a processing unit, a general-purpose central processing unit (CPU) complex, a field programmable gate array (FPGA), an application specific integrated circuit (ASIC), a graphics processing unit (GPU), or another parallel data processor such as a digital signal processing (DSP) core, and so forth. As described earlier, the functional unit 150 is representative of any circuitry with its own voltage and clock domain. For example, the functional unit 150 can be a memory controller, an input/output (I/O) hub controller, or other. A single voltage and clock domain is discussed here for ease of illustration. In some embodiments, an age tracking unit 110 is used for a particular voltage and clock domain. In other embodiments, an age tracking unit 110 is used for multiple voltage and clock domains.

Although it is shown that the parameter selector 142 determines the operational parameters of the functional unit 150, in other embodiments, other units receive the operational parameters 144, and determine values for the operational parameters to provide to the functional unit 150. In yet other embodiments, the age tracking unit 110 sends feedback information 132 directly to these other units, rather than to the power manager 140. These values of the operational parameters 144 are used by the functional unit 150 until a next event occurs that causes the value to be updated. Examples of these events are one or more of an update of the feedback information 132, an update of a power-performance state (P-state), a detection that a particular amount of time has elapsed, and so forth. One example of these other units is an on-die voltage regulator unit used to generate the power supply voltage by modulating a resistance such that the operational voltage reference being output from a voltage rail is maintained at a determined voltage. The determined voltage is based on a measured voltage droop. Similarly, calibration circuitry of the on-die voltage rails of the functional unit 150 adjusts the operational voltage based on receiving an indication of voltage droop.

Another example of these other units determining values for the operational parameters to provide to the functional unit 150 is an adaptive clocking unit. The adaptive clocking unit reduces the operational clock frequency based on an indication of an amount of voltage droop. Yet another example of these other units is a reliability monitor used to monitor aging effects, predict a remaining life span of the functional unit 150, and/or make adjustments of the operating parameters to prolong the life span of the functional unit 150. It is possible that any one of these units are used in tandem with the power manager 140. It is also possible that any one of the above configurations describing the interconnections of units is used in the computing system 100 based on design requirements. Although the below discussion describes the parameter selector 142 setting the operational parameters 144 for use by the functional unit 150, it is possible and contemplated that one or more of the above other units and other configurations is used in computing system 100.

It is possible for the operating power supply voltage of the functional unit 150 to vary from an expected value over time. In addition to IR (current-resistance) voltage droop and parasitic inductance voltage droop, aging of circuits contributes to data retention corruption and timing failures in critical paths of the functional unit 150. One example of aging is negative bias temperature instability (NBTI). Another example is time-dependent dielectric breakdown (TDDB), which occurs when the gate oxide breaks down as a result of long-time application of a relatively low electric field being applied over a long duration. The breakdown is caused by formation of electron tunneling current forms a conducting path through the gate oxide to the substrate. Typically, the metal oxide semiconductor (MOS) field effect transistor (FET) is operating near or beyond its specified operating voltage. Another type of circuit failure occurs when electromigration gradually moves ions in a conductor during applications of high current densities. For example, copper or other traces used as long conducting wires for an appreciable amount of time experience diffusing metal atoms. As transistor widths and trace widths decrease, the effects of electromigration increase.

The computing system 100 can be used in medical equipment, automotive systems such as anti-lock braking systems, banking and business-critical storage and processing systems, space travel systems and so forth. Due to the difficulty of testing under real conditions, equations anticipating the use and worst-case conditions were used to predict the life span of integrated circuits. For example, the integrated circuits in the functional unit 150 may have gone through high temperature operating life testing and the expected life span under real conditions was extrapolated from data gathered during the testing. However, the age tracking unit 110 replaces the anticipated use approach and provides real-time feedback under real usage conditions to monitor and adjust usage to satisfy a reliability target and take advantage of available performance.

In one example, a region is an area of the semiconductor die of the functional unit 150 that includes one of a variety of integrated circuits such as integrated circuit 158. Examples of the integrated circuit 158 are a processor core (or core) of multiple processor cores, a memory controller, an interface unit, an arithmetic logic unit and so forth. Although three power supply monitors for measuring operational voltage references in three regions and a single integrated circuit are shown, in other embodiments, the functional unit 150 includes another number of power supply monitors and integrated circuits. The functional unit 150 uses the multiple power supply monitors (PSMs) 152, 154 and 156 to provide a measured operating voltage reference as part of the actual usage values 160.

Each of the power supply monitors 152-156 measures an average operating voltage reference over a particular time period and generates an indication of a count corresponding to the measured operating voltage reference. For example, each the power supply monitors 52-156 receives the operating voltage reference from power supply voltage generating circuitry, and generates an indication of a count corresponding to the measured operating voltage reference. A mapping exists that relates the count determined over the particular time period to values of operating voltage references. In various embodiments, the power supply monitors 152-156 are implemented as time-to-digital converters (TDCs), and each of the power supply monitors 152-156 uses a ring oscillator that generates a toggling signal with alternating rising edges and falling edges during a particular time period. The power supply monitors 152-156 additionally use counters to count the number of edges during the particular time period. The count corresponds to the measured operational voltage reference. In various embodiments, the power supply monitors 152-156 use any of a variety of ring oscillator designs known to those skilled in the art. In addition, the counters of the power supply monitors 152-156 are one of a variety of counters for ring oscillators. For example, the counters are one of a variety of linear feedback shift registers (LFSRs), asynchronous counters, or ripple counters. Examples of the sequential elements are one of a variety of flip-flop circuits and latches. In various embodiments, the power supply monitors 152-156 use encoders to convert the state information of the counters into a binary count value, which is sent to the control unit 130 via the actual usage values 160.

In one example, during testing, designers determined a count of 700 is associated with an operational reference voltage being 1.1 volts (V). If the PSM 152 sends a count of 667 to the age tracking unit 110, then the control unit 130 determines the count difference of 33 between the received measured value (e.g., 667) and the expected value (e.g., 700) is associated with a 5% difference with the desired operational reference voltage of 1.1V. In this case, the measured operational voltage reference is near 1.05V or nearly 5% below the expected 1.1V. Therefore, the control unit 130 sends an indication to the power manager 140 to update the operational reference voltage to be 1.15V, rather than 1.1V. Therefore, the region of the functional unit 150 corresponding to the PSM 152 that is experiencing aging effects provides an operational voltage reference of 1.1V, or 5% below the 1.15V indicated voltage reference.

The age tracking unit 110 receives and stores a copy 112 of the actual usage values 160 when a particular time interval elapses. In some embodiments, the time interval is a value stored in a programmable configuration register. Other examples of the actual usage values 160 sent from the functional unit 150 are an activity level of the circuitry, an operational current, outputs of one or more temperature sensors and current sensors, and an estimation of power consumption. In some designs, the estimation of power consumption uses weighted values of particular sampled signals of the functional unit 150.

The age counter 120 stores a value representative of an age of the functional unit 150. The age provides an indication of an amount of usage and stress experienced by the functional unit 150. In an embodiment, there is an age counter 120 for each of multiple regions of the functional unit 150. In other embodiments, a single age counter 120 is used for the functional unit 150. In various embodiments, the age counter 120 is a time counter that stores an indication of a duration of time, which is used to indicate an amount of usage and stress experienced by the functional unit 150. In other words, the particular duration of time stored in the age counter 120 can be used as an indication of an age of the functional unit 150, and this age can be used to estimate an amount of usage and stress experienced by the functional unit 150.

In an embodiment, the age counter 120 is implemented by a 32-bit register, which counts, or increments, each time a particular time interval elapses such as a second. This age counter is capable of counting from zero to $4.2 \times 10^9$ seconds, which equals 136 years. The age counter 120 is initialized with an initial age and begins incrementing from the initial age. The control unit 130 of the age tracking unit 110 is capable of sending a notification with a request to measure an operating voltage reference of the functional unit 150. The control unit 130 sends this notification during particular events. Examples of such events are a boot of the functional unit 150 and detected idle times of the functional unit 150. In response to the request, a measurement of the operating voltage reference is performed (e.g., by one of the power supply monitors 152-156). When the control unit 130 receives a measured operating voltage reference from the actual usage values 112, the control unit 130 determines an updated age of the region different from the current age stored in the age counter 120.

The updated age is based on the measured operating voltage reference. For example, the control unit 130 determines a voltage difference between a desired operating voltage reference and the measured operating voltage reference. The control unit 130 uses the voltage difference to access a table. For example, the age tracking unit 110 includes a table of the lookup tables 116 that has circuitry capable of storing, in multiple entries, mappings between voltage differences with the desired operating voltage reference and corresponding ages of the region of the functional unit 150. The lookup tables 116 and the memory 114 are implemented with one or more of registers, flip-flop circuits, one of a variety of random access memories, a content addressable memory (CAM), and so forth. A copy of the content of the lookup tables 116 is also stored in non-volatile memory such as a hard disk, a solid state drive, a read only memory (ROM), or other.

In various embodiments, the age tracking unit 110 includes multiple tables, one for each of the multiple operating voltage references used in the multiple power-performance states of the functional unit 150. In some embodiments, the age tracking unit 110 has multiple tables for a particular operating voltage reference and one of the tables is selected for use in determining an age of the device. For example, different tables may be maintained that correspond to a worst-case condition(s), an average or typical case condition(s), or a best-case condition(s) regarding stress and aging. The selected table of lookup tables 116 stores values that are, for example, determined during stress testing of the functional unit or otherwise. For example, the selected table of lookup tables 16 stores information relating voltage differences with the desired operating voltage reference and corresponding ages of the region. The control unit 130 indexes into the selected table with the determined voltage difference and reads out the corresponding age. The control unit 130 updates the age counter 120 with the age read from the table of the lookup tables 116. In some cases, the updated age from the table of the lookup tables 116 is younger than the previous age stored in the age counter 120 due to the region not experiencing stress and aging as predicted during testing of the functional unit 150.

During particular time periods, the control unit 130 determines when to update the operating voltage reference of the functional unit 150 due to aging. One example of these time periods is a particular time interval has elapsed. In some designs, the particular time interval is stored in a programmable configuration register. Another example of these time periods is the power manager 140 indicates it is updating operating parameters 144 of the functional unit 150. The control unit 130 determines a voltage adjustment for the operating voltage reference based at least in part on an age indicated by the age counter 120.

The age tracking unit 110 includes a similar table as the previous table storing voltage differences with the desired operating voltage reference and corresponding ages of the region. In some designs, the control unit 130 accesses the same table, but provides an indication that the index is an age, rather than a voltage difference. The control unit 130 selects a table based on the desired operating voltage reference and the determined conditions of operation for the functional unit 150. The control unit 130 indexes into the selected table with the age read from the age counter 120, reads out a voltage adjustment, and sends an indication, via the feedback information 132, to the power manager 140 specifying how to update the desired operating voltage reference with the voltage adjustment. The parameter selector 142, within the power manager 140, uses the feedback information 132 from the age tracking unit 110 to select operational parameters 144 for the functional unit 150.

Figure 2:
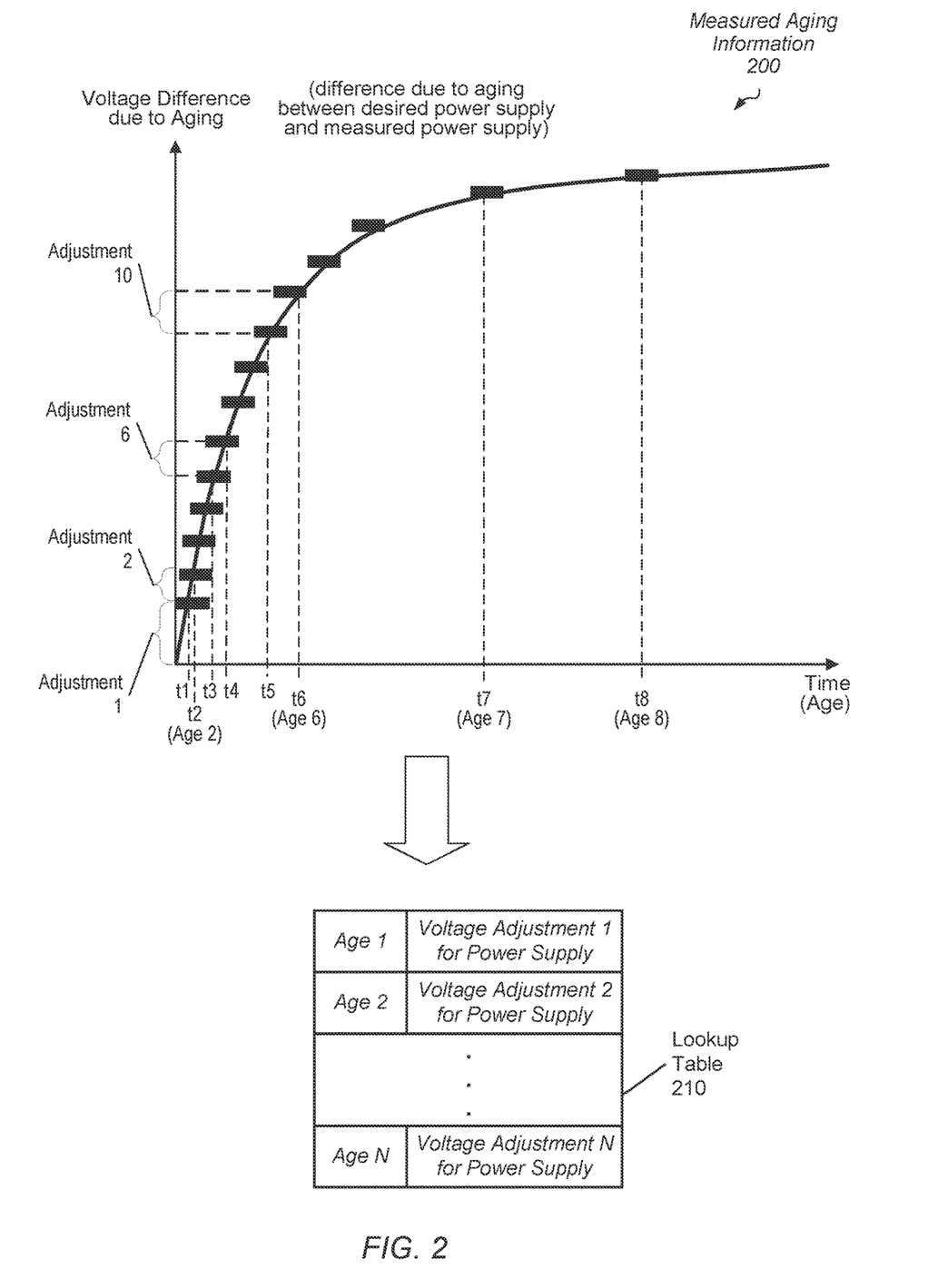
FIG. 2 is a generalized diagram of one embodiment of measured aging information for an integrated circuit.

Referring now to FIG. 2, one embodiment of measured aging information 200 for an integrated circuit is shown. A graph is shown relating voltage differences with time duration. Here, the voltage differences are differences between two voltages. The first voltage is a desired power supply voltage (operational voltage reference) for an integrated circuit selected by a power manager or other circuitry. The second voltage is a measured power supply voltage (operational voltage reference). The lookup table 210 includes the information provided by the graph. The ages in the lookup table (or table) 210 correspond to ranges of duration of time in the graph. In one example, time t6 indicates one year, whereas, the time t7 indicates three years. Therefore, a duration of time between t6 and t7 is two years. However, in this example, the time t4 indicates six months, so the duration of time between t4 and t6 is six months. Other examples of time durations corresponding to time markings on the graph are possible and contemplated.

The voltage adjustments in the table 210 correspond to the voltage adjustments on the y-axis of the graph. The voltage adjustments (adjustments) indicate voltage differences due to aging between a desired power supply voltage and a measured power supply voltage. Examples of ranges of the adjustments are 5 millivolts (mV), 10 mV, or other. In some embodiments, the ranges of voltage adjustments on the y-axis of the graph are piecewise linear segments of the measured graph, so each voltage difference range indicated by the thick horizontal lines on the graph corresponds to a same voltage difference, or a same additional voltage droop from the expected operational voltage reference. In one example, each piecewise linear segment of the graph corresponds to an additional 5 millivolt (mV) voltage droop from the expected operational voltage reference. In such a case, after aging from time 0 to time t1 (age 1), which corresponds to adjustment 1, the aging model derived from lab testing expects that the functional unit experiences a 5 mV voltage droop from the desired operational voltage. For example, by time 1 (age 1), the functional unit operates with an operational voltage reference of 1.095V when a power manager or other circuitry indicates the use of a desired operational reference voltage of 1.1V.

It is noted that, in some embodiments, the same adjustment is used for any age indicated by the age counter between any two ages of a linear segment. Therefore, when an age counter indicates an age between age 0 and age 1, the same voltage adjustment indicated by adjustment 1, such as 5 mV, is used to adjust the power supply voltage. Similarly, when an age counter indicates an age between age 1 and age 2, the same voltage adjustment indicated by adjustment 2, such as 10 mV, is used to adjust the power supply voltage.

In various embodiments, a lookup operation is performed on the table 210 based on a current value of a time counter, such as an age counter, and one of the multiple voltage adjustments is found. The found voltage adjustment is used to adjust the generation of a power supply voltage. In some embodiments, the lookup operation of table 210 is performed during a boot operation. In other embodiments, the lookup operation is additionally performed each time a particular time interval elapses, and this time interval is stored in a programmable configuration register. In one example, the time interval is one second, but other time intervals are possible and contemplated.

In various embodiments, the information displayed in the graph is derived from hours of stress tests of a functional unit. The stress tests include placing the functional unit in operating conditions that include high operating voltage references, high temperature and particular workloads that increase the activity levels of particular portions of the functional unit. The stress tests provide predicted aging effects on the functional unit. In another example, after the functional unit ages from time t1 to time t2, the aging model derived from lab testing expects that the functional unit experiences an additional 5 mV voltage droop, or 10 mV total voltage droop, by time t2 (age 2). For example, by time t2 (age 2), the functional unit operates with an operational voltage reference of 1.09V when a power manager or other circuitry indicates the use of a desired operational reference voltage of 1.1V. As described earlier, when an age counter indicates an age between age 1 and age 2, the same voltage adjustment indicated by adjustment 2, such as 10 mV, is used to adjust the power supply voltage.

Skipping over adjustments 3-5 (not labeled), after aging from time t3 (age 3) to time t4 (age 4), which corresponds to adjustment 6, the aging model derived from lab testing expects that the functional unit experiences an additional 5 mV voltage droop from the voltage droop of adjustment 5 (not labeled). When each of the adjustments correspond to a piecewise linear segment of the graph, the voltage droop of adjustment 5 is 25 mV. Therefore, the voltage droop of adjustment 6 is 30 mV. It is noted that time markings are not shown between time t4 and time t5 for ease of illustration. However, each of the graph and table 210 includes information about the time markings and voltage adjustments for these additional ages.

When the age counter stores an age indicating the time t6 (age 6), which corresponds to adjustment 10, the aging model derived from lab testing expects that the functional unit experiences an additional 5 mV voltage droop from the voltage droop of adjustment 9 (not labeled). When each of the adjustments correspond to a piecewise linear segment of the graph, the voltage droop of adjustment 9 is 45 mV. Therefore, the voltage droop of adjustment 10 is 50 mV. This information is stored in the lookup table 210, and can be used by the control unit of an age tracking unit such as control unit 130 of age tracking unit 110 (of FIG. 1). For example, when the control unit reads an age value from an age counter, the control unit searches the table 210 with the age value.

When the age counter stores an age between time t1 and time t2 (or between age 1 and age 2), the access circuitry of the table 210 determines the index value based on the age is between a first entry for Age 1 and a second entry for Age 2. The access circuitry determines the age read from the age counter is greater than Age 1, but less than or equal to Age 2. Therefore, the access circuitry of the table 210 accesses the second entry for Age 2, and provides Voltage Adjustment 2 for Power Supply. In one embodiment, the voltage adjustment of this second entry is 10 mV. Other table organizations and access steps for determining the voltage adjustment based on an age value from an age counter are possible and contemplated. As described earlier, in some embodiments, the lookup operation of table 210 is performed during a boot operation. In other embodiments, the lookup operation is additionally performed each time a particular time interval elapses, and this time interval is stored in a programmable configuration register. In one example, the time interval is one second, but other time intervals are possible and contemplated.

Figure 3:
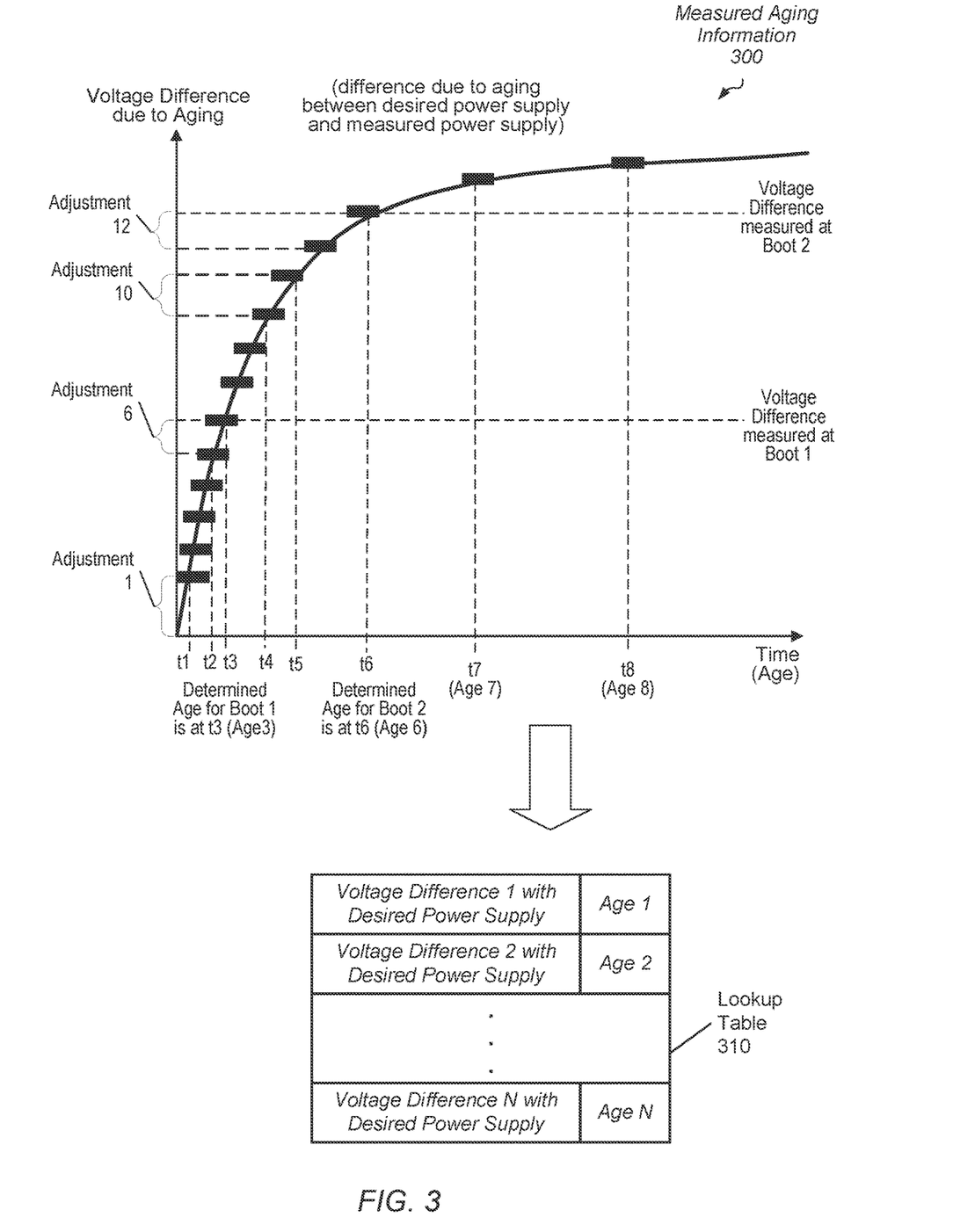
FIG. 3 is a generalized diagram of one embodiment of measured aging information for an integrated circuit.

Referring now to FIG. 3, one embodiment of measured aging information 300 for an integrated circuit is shown. A graph is shown relating voltage differences with time duration such as ages of a functional unit. In various embodiments, the graph includes the same mapping information as the graph of measured aging information 200 (of FIG. 2). Here, though, the information of the graph is used to create the lookup table (or table) 310. In contrast to the earlier table 210, which is indexed by age information to read out a voltage difference, the table 310 is indexed by a measured voltage difference to read out an age. Therefore, a control unit, such as the control unit 130 (of FIG. 1), can receive a measured operational voltage reference from a power supply monitor, determine a voltage difference between a desired operational voltage reference and the measured operational voltage difference, index into the table 310 with the determined voltage difference, read out a corresponding age, and update an age counter with the corresponding age. During a boot of the computing system, rather than use a previously stored age of the functional unit, the control unit initializes the age counter with an age read out from table 310.

In one example, prior to a first boot (or boot up operation) of the computing system, the age counter stores a particular age. Rather than store this particular age in non-volatile memory, and later use this particular age to initialize the age counter, the table 310 is used to provide an age for initializing the age counter. In one example, the first boot (or boot up operation) of the computing system occurs after the functional unit of the computing system has aged from time 0 to time t3 (age 3). However, the particular age stored in the age counter indicates another age different from age 3 that is actually experienced by the functional unit. For example, the age counter may store an age older than age 3, since the functional unit has not been under stress as predicted by stress tests in the lab prior to fabrication and being placed in a product. In another example, the age counter may store an age younger than age 3, since the functional unit has been under greater stress than predicted by stress tests in the lab prior to fabrication and being placed in a product.

During the first boot (Boot 1 in the graph), the power supply monitor measures an operational voltage reference of the functional unit. A control unit determines a voltage difference between a desired operational voltage reference for the functional unit and the measured operational voltage reference. In one example, the control unit determines the voltage difference is between 25 mV and 30 mV such as 28 mV. The control unit sends the index indicating 28 mV to access circuitry of table 310. The access circuitry searches table 310, and determines the index is greater than 25 mV of adjustment 5, but less than or equal to 30 mV of adjustment 6. Therefore, the access circuitry selects the entry corresponding to adjustment 6, and reads out an age (age 6 or time t6) from the selected entry.

In some embodiments, the granularity of table 310 is finer than table 210 to provide finer increments between ages. In other embodiments, the access circuitry indicates the index is between two adjustments, such as adjustment 5 (25 mV) and adjustment 6 (30 mV), and the control unit uses a linear relationship to adjust the age. For example, when the control unit determines the voltage difference of 28 mV, the control unit adjusts the age to be the time t2 summed with three fifths of the difference between time t2 and time t3, since the voltage difference of 28 mV is an additional three fifths of the 5 mV voltage difference between 25 mV of adjustment 5 and 30 mV of adjustment 6.

After determining the age from accessing table 310, the control unit uses this age to initialize the age counter during the boot operation. Therefore, the initialization of the age counter relies on table 310, rather than relying on data storage of a previous value of the age counter. During a later boot operation (Boot 2 in the graph), the control unit determines the voltage difference is 60 mV. The control unit indexes into the table 310 with the 60 mV voltage difference, determines the voltage difference corresponds to adjustment 12, and reads out an age corresponding to time t6 on the graph. The control unit uses this age to initialize the age counter during the boot operation. Therefore, as the functional unit (or integrated circuit) ages, the age counter is updated over time with values more indicative of the amount of usage and stress experienced by the functional unit (or integrated circuit). As one example, after 6 months of usage, the functional unit experiences 30 mV of voltage degradation and requires a 30 mV (or similar) voltage adjustment added to its desired operational voltage reference. After one year of usage, the functional unit experiences 45 mV of voltage degradation and requires a 45 mV (or similar) voltage adjustment added to its desired operational voltage reference. After 3 years of usage, the functional unit experiences 55 mV of voltage degradation and requires a 55 mV (or similar) voltage adjustment added to its desired operational voltage reference. Using table 210 (of FIG. 2), the voltage adjustment is determined and applied. Using table 310, the age counter is updated based on a measured voltage difference.

Figure 4:
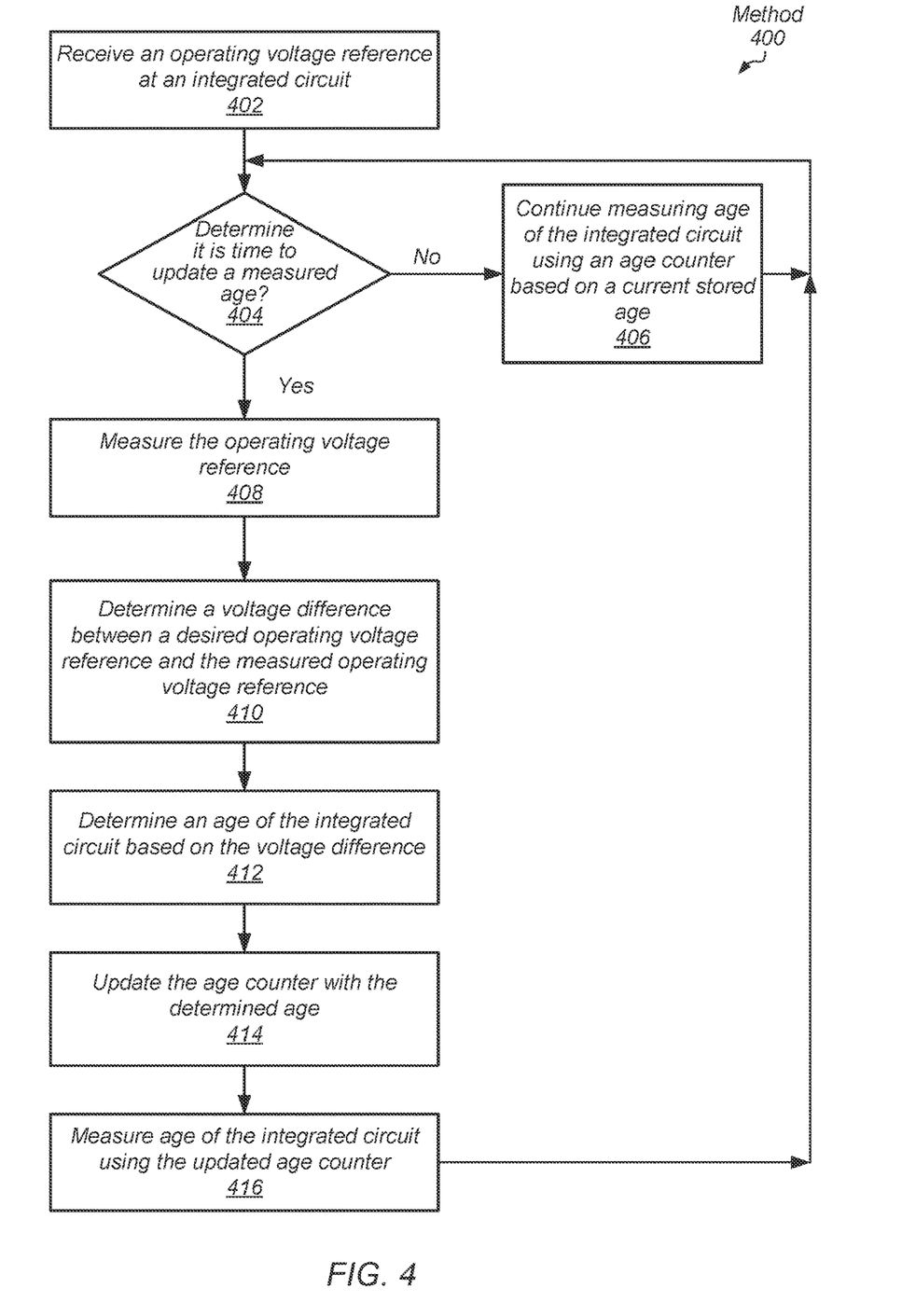
FIG. 4 is a generalized diagram of another embodiment of a method for updating a measured age of an integrated circuit.

Referring now to FIG. 4, one embodiment of a method 400 for updating a measured age of an integrated circuit is shown. For purposes of discussion, the steps in this embodiment (as well as in FIG. 5) are shown in sequential order. However, in other embodiments some steps occur in a different order than shown, some steps are performed concurrently, some steps are combined with other steps, and some steps are absent.

A region of an integrated circuit using a power supply monitor receives an operating voltage reference (block 402). An age tracking unit of the integrated circuit uses an age counter capable of maintaining an age of the integrated circuit. The age tracking unit also uses a control unit for determining when to update one or more of the age counter and an operating voltage reference of the region. Examples of the time periods for updating these values are a boot of a computing system using the integrated circuit and idle times of the integrated circuit as determined by a power manager. If the control unit determines it is not time to update the measured age ("no" branch of the conditional block 404), then the age counter continues measuring the age of the integrated circuit based on a current stored age (block 406).

If the control unit determines it is time to update the measured age ("yes" branch of the conditional block 404), then the control unit notifies the power supply monitor of the region to measure the operating voltage reference (block 408). When the control unit receives the measured operating voltage reference, the control unit determines a difference between a desired operating voltage reference and the measured operating voltage reference (block 410). For example, the desired operating voltage reference is 1.1V, but the power supply monitor measures 1.05V. The control unit determines the voltage difference is 0.05V, or 50 millivolts (mV).

The control unit determines an age of the integrated circuit based on the voltage difference (block 412). In some embodiments, the age tracking unit uses a table that has circuitry capable of storing, in multiple entries, voltage differences with the desired operating voltage reference and corresponding ages of the region. The table stores values determined during stress testing of the functional unit. In some embodiments, the table is equivalent to the lookup table 310 (of FIG. 3). In various embodiments, the age tracking unit includes multiple tables, one for each of the multiple operating voltage references used in the multiple power-performance states of the integrated circuit. In some embodiments, the age tracking unit has three tables for a particular operating voltage reference and one of the three tables is selected based on the control unit determining the integrated circuit is used in a worst-case, average or typical case, or best-case conditions. The control unit indexes into the selected table with the determined voltage difference and reads out the corresponding age.

The control unit updates the age counter with the determined age (block 414). The age counter measures age of the integrated circuit using the updated age (block 416). It is noted that in some cases, the updated age is younger than the previous age stored in the age counter due to the region of the integrated circuit not experiencing stress and aging as predicted during testing of the integrated circuit.

Figure 5:
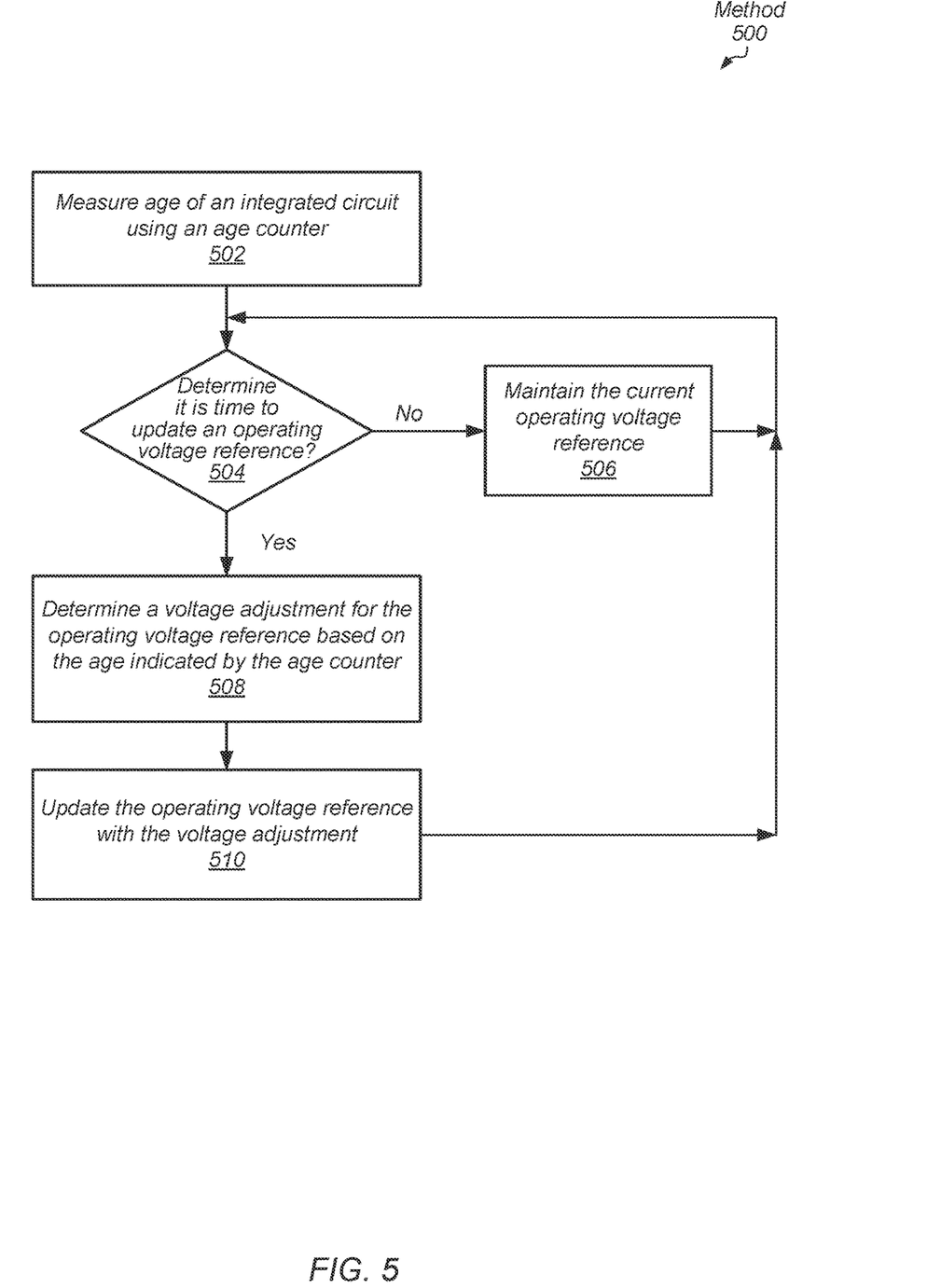
FIG. 5 is a generalized diagram of another embodiment of a method for updating power supply voltages due to variations from aging.

Turning now to FIG. 5, one embodiment of a method 500 for updating power supply voltages due to variations from aging is shown. A region of an integrated circuit uses a power supply monitor to measure variations of an operating voltage reference in the region. An age tracking unit of the integrated circuit uses an age counter. The age counter measures an age of the integrated circuit (block 502). The age tracking unit also uses a control unit for determining when to update one or more of the age counter and an operating voltage reference of the region. Examples of the time periods for updating these values are one or more of a boot operation of a computing system using the integrated circuit, idle times of the integrated circuit as determined by a power manager, and each time a particular time interval elapses. In an embodiment, this time interval is stored in a programmable configuration register. In one example, the time interval is one second, but other time intervals are possible and contemplated. If the control unit determines it is not time to update the operating voltage reference ("no" branch of the conditional block 504), then the power manager receives no indication from the control unit to update the operating voltage reference, and thus, maintains the current operating voltage reference (block 506).

If the control unit determines it is time to update the operating voltage reference ("yes" branch of the conditional block 504), then the control unit determines a voltage adjustment for the operating voltage reference based on the age indicated by the age counter (block 508). The age tracking unit uses one or more tables as described earlier relating the voltage differences with the desired operating voltage reference and corresponding ages of the region. In some embodiments, the table is equivalent to the lookup table 210 (of FIG. 2). The control unit selects one of the multiple tables, and the control unit indexes into the selected table with the age read from the age counter. The control unit reads out a voltage adjustment from the table. The control unit sends an indication of the voltage adjustment to a power manager or other circuitry that selects operating parameters for the integrated circuit. With the indication from the control unit, the power manager or other circuitry updates the operating voltage reference with the voltage adjustment (block 510).

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
an age tracking unit comprising circuitry configured to measure a first age of the apparatus; and
a control unit comprising circuitry configured to:
receive, from a power supply monitor, an operating voltage reference measured by the power supply monitor;
determine a second age different from the first age of the apparatus based on the operating voltage reference; and
update the first age with the second age.

2. The apparatus as recited in claim 1, wherein the control unit is further configured to:
determine an operating voltage difference between a desired operating voltage reference and the operating voltage reference measured by the power supply monitor; and
determine the second age of the apparatus based on the operating voltage difference.

3. The apparatus as recited in claim 2, wherein the apparatus further comprises circuitry configured to store mappings between voltage differences with the desired operating voltage reference and corresponding ages of the apparatus.

4. The apparatus as recited in claim 3, wherein the control unit is further configured to access the mappings with the operating voltage difference.

5. The apparatus as recited in claim 2, wherein the second age is younger than an age previously stored by the age tracking unit.

6. The apparatus as recited in claim 1, wherein the control unit is further configured to determine a voltage adjustment for the operating voltage reference based at least in part on an age indicated by the age tracking unit.

7. The apparatus as recited in claim 6, wherein the control unit is further configured to update the operating voltage reference with the voltage adjustment.

8. A method comprising:
measuring, by circuitry of an age tracking unit, a first age of an integrated circuit;

receiving, from a power supply monitor by the circuitry of the age tracking unit, an operating voltage reference measured by the power supply monitor;

determining, by the circuitry of the age tracking unit, a second age different from the first age of the integrated circuit based on the operating voltage reference; and updating, by the circuitry of the age tracking unit, the first age with the second age.

9. The method as recited in claim 8, further comprising:
determining an operating voltage difference between a desired operating voltage reference and the operating voltage reference measured by the power supply monitor; and determining the second age of the integrated circuit based on the operating voltage difference.

10. The method as recited in claim 9, further comprising storing mappings between voltage differences with the desired operating voltage reference and corresponding ages of the integrated circuit.

11. The method as recited in claim 10, further comprising accessing the mappings with the operating voltage difference.

12. The method as recited in claim 9, wherein the second age is younger than an age previously stored by the age tracking unit.

13. The method as recited in claim 8, further comprising determining a voltage adjustment for the operating voltage reference based at least in part on an age indicated by the age tracking unit.

14. The method as recited in claim 13, further comprising updating the operating voltage reference with the voltage adjustment.

15. A functional unit comprising:
an integrated circuit;
a power supply monitor comprising circuitry configured to measure an operating voltage reference of the integrated circuit; and an age tracking unit comprising:
an age counter comprising circuitry configured to measure a first age of the integrated circuit; and
a control unit comprising circuitry configured to:
receive the operating voltage reference from the power supply monitor;
determine a second age different from the first age of the integrated circuit based on the operating voltage reference; and
update the first age with the second age.

16. The functional unit as recited in claim 15, wherein the control unit is further configured to:
determine an operating voltage difference between a desired operating voltage reference and the operating voltage reference measured by the power supply monitor; and
determine the second age of the integrated circuit based on the operating voltage difference.

17. The functional unit as recited in claim 16, wherein the age tracking unit is further configured to store mappings between voltage differences with the desired operating voltage reference and corresponding ages of the integrated circuit.

18. The functional unit as recited in claim 17, wherein the control unit is further configured to access the mappings with the operating voltage difference.

19. The functional unit as recited in claim 16, wherein the second age is younger than an age previously stored by the age tracking unit.

20. The functional unit as recited in claim 15, wherein the control unit is further configured to determine a voltage adjustment for the operating voltage reference based at least in part on an age indicated by the age counter.

* * * * *